United States Patent [19]

Vig

[11] Patent Number: 5,578,890
[45] Date of Patent: Nov. 26, 1996

[54] CRYSTAL RESONATOR PACKAGE

[75] Inventor: John R. Vig, Colts Neck, N.J.

[73] Assignee: The United States of America as represented by the Secretary of the Army, Washington, D.C.

[21] Appl. No.: 366,125

[22] Filed: Dec. 29, 1994

[51] Int. Cl.[6] .................................................. H01L 23/04
[52] U.S. Cl. .......................... 310/340; 310/344; 310/348
[58] Field of Search ................................... 310/340, 344, 310/348

[56] References Cited

U.S. PATENT DOCUMENTS

| | | | |
|---|---|---|---|
| 4,882,115 | 11/1989 | Schmickl | 361/538 |
| 4,975,762 | 12/1990 | Stradley et al. | 357/74 |
| 5,034,357 | 7/1991 | Yamakawa et al. | 501/96 |

FOREIGN PATENT DOCUMENTS

| | | | |
|---|---|---|---|
| 0691680 | 1/1996 | European Pat. Off. | H01L 23/04 |
| 3638342 | 5/1988 | Germany | 310/340 |
| 1116043 | 5/1989 | Japan | 310/348 |
| 1116041 | 5/1989 | Japan | 310/348 |

*Primary Examiner*—Thomas M. Dougherty
*Attorney, Agent, or Firm*—Michael Zelenka; William H. Anderson

[57] ABSTRACT

An improved crystal resonator package is provided using high purity aluminum.

5 Claims, No Drawings

CRYSTAL RESONATOR PACKAGE

GOVERNMENT INTEREST

The invention described herein may be manufactured, used, and licensed by or for the Government for governmental purposes without the payment to me of any royalties thereon.

FIELD OF INVENTION

This invention relates in general to crystal resonator packages and in particular to crystal resonator packages for resonators having an improved long term frequency stability or aging.

BACKGROUND OF THE INVENTION

Outgassing of the crystal resonator package limits the long term stability of crystal resonators. In the past, ceramic, metal, and glass packages have been used as crystal resonator packages for resonators of good long term frequency stability. Although ceramic packages have the best outgassing properties, the difficulty with the ceramic packaging is that it is very expensive to implement, and plagued with yield problems due to difficulties related to the ceramic package. The problems include the difficulty of maintaining the flatness of the ceramic parts during metallization and firing, breakage when the sealing pressure is applied to parts that are not sufficiently flat, delamination of the metallizations, and leaks due to various causes, and high manufacturing costs.

Metal packages have been made of nickel plated copper, or nickel, or kovar (which is an iron-nickel-cobalt alloy), or copper clad kovar, or gold plated nickel clad copper. The bases of metal packages, where the electrical leads enter the package, have been made of kovar, as kovar is a standard material for glass to metal seals. Aluminum has been thought not to be suitable for packages because aluminum has relatively poor mechanical properties, aluminum is relatively difficult to weld, and ordinary aluminum is not a good vacuum material due to the outgassing of impurities in the material. Outgassing is highly undesirable because the contaminants produced by the outgassing will adsorb onto the resonator surfaces and thereby degrade the resonator's stability. Lately, however, pure aluminum has been found to be an outstanding vacuum material. In fact, vacuum systems containing vacuum chambers made of pure aluminum, with smooth and properly cleaned inner surfaces, have achieved $10^{-13}$ torr pressures. These are among the lowest pressures ever achieved on earth.

SUMMARY OF THE INVENTION

The general object of this invention is to provide a crystal resonator package for resonators of improved long term frequency stability or aging. A further object of the invention is to overcome the difficulties associated with the use of ceramic packages for crystal resonators. A still further object of the invention is to provide a material that outgasses at orders of magnitude less than the metals and glasses commonly used in packaging quartz resonators.

It has now been found that high purity aluminum can be used as a crystal resonator packaging and that it is superior to metals, glass, and ceramics previously used in ultrahigh vacuum systems.

By ultrahigh vacuum as the term is used herein is meant a vacuum chamber that has achieved about $10^{-8}$ to about $10^{-13}$ torr. By high purity aluminum is meant aluminum of about 98% or higher purity.

High purity aluminum is now known to be capable of being an excellent vacuum material; that is, properly prepared aluminum produces very low outgassing. Moreover, if the high purity aluminum possesses smooth surfaces and is properly oxidized, then the surface ought to be nearly equivalent to that of the high alumina ceramics. The thinner the oxide layer, the easier it will be to seal the package. It is also known that aluminum surfaces that have been exposed to air are always coated with a thin oxide layer. Therefore, one might say the invention is a crystal resonator package the inside surfaces of which are made of high purity aluminum oxide. Such a package would overcome the difficulties of ceramic packages while retaining the advantages of such packages.

DESCRIPTION OF THE PREFERRED EMBODIMENT

High purity aluminum by itself may not be suitable for a crystal package because it is very soft, especially after exposure to the high temperatures that are typically used during the fabrication of precision resonators, unless aluminum of sufficient thickness to provide adequate structural rigidity is utilized. Therefore, the package is made of a stronger metal as for example, stainless steel, Kovar, nickel alloys or molybdenum that is plated with high purity aluminum, or which is clad to high purity aluminum. Alternatively, the package can be a conventional glass or ceramic package the inside surfaces of which are plated with high purity aluminum such that the inside surfaces of the package is made of pure aluminum. Another alternative is to form the package out of high purity aluminum, then place this package into another one that provides the aluminum with mechanical support. The preferred sealing methods are those that rely on the adhesion between clean surfaces. An attractive method is to use a high purity aluminum gasket between high purity aluminum sealing surfaces on the package. Pressure on the gaskets results in large deformations that break the oxide and the other contaminant layers, and expose atomically clean aluminum surfaces, and results in clean surface to clean surface adhesion. Ultrasonic vibration of the sealing surfaces may be used to enhance the breakup of the oxide layers. Performing the sealing at high temperature of about 300° C. in a vacuum also enhances the sealing effectiveness.

In another embodiment of the invention, to minimize the oxide layer thickness, a fresh film of aluminum is deposited in ultra high vacuum onto the sealing surfaces just before sealing. If the sealing surfaces are sufficiently flat, then a seal can be produced without the use of a gasket, especially if the breakage of the thin contaminant layer adsorbed onto the sealing surfaces is assisted by ultrasonic energy. In yet another embodiment, an aluminum alloy is used. Alloys such as aluminum-titanium can possess much higher strength than pure aluminum, while maintaining good outgassing properties.

I wish it to be understood that I do not desire to be limited to the exact details of construction shown and described for obvious modifications will occur to a person skilled in the art.

What is claimed is:

1. A metal crystal resonator package having a cavity lined with high purity aluminum for housing a crystal resonator under ultra high vacuum wherein the metal is selected from the group comprising stainless steel, aluminum alloy, nickel alloys, and molybdenum.

2. A crystal resonator package according to claim 1 wherein the metal is stainless steel.

3. A crystal resonator package according to claim 1 wherein the metal is a nickel alloy.

4. A crystal resonator package according to claim 1 wherein the metal is molybdenum.

5. A crystal resonator package according to claim 1 wherein the metal is an aluminum alloy.

* * * * *